(12) United States Patent
Büsgen et al.

(10) Patent No.: US 9,231,186 B2
(45) Date of Patent: Jan. 5, 2016

(54) ELECTRO-SWITCHABLE POLYMER FILM ASSEMBLY AND USE THEREOF

(75) Inventors: Thomas Büsgen, Köln (DE); Werner Jenninger, Köln (DE); Joachim Wagner, Köln (DE); Evelyn Peiffer, Leverkusen (DE); Gerhard Maier, München (DE); Robert Gärtner, Schöngelsing (DE)

(73) Assignee: Parker-Hannifin Corporation, Cleveland, OH (US)

( * ) Notice: Subject to any disclaimer, the term of this patent is extended or adjusted under 35 U.S.C. 154(b) by 1062 days.

(21) Appl. No.: 13/263,400

(22) PCT Filed: Mar. 30, 2010

(86) PCT No.: PCT/EP2010/002001
§ 371 (c)(1),
(2), (4) Date: Feb. 7, 2012

(87) PCT Pub. No.: WO2010/115549
PCT Pub. Date: Oct. 14, 2010

(65) Prior Publication Data
US 2012/0128960 A1    May 24, 2012

(30) Foreign Application Priority Data
Apr. 11, 2009  (EP) .................................. 090052804

(51) Int. Cl.
*H01L 41/09* (2006.01)
*G06F 3/045* (2006.01)
*G06F 3/01* (2006.01)
*F15D 1/12* (2006.01)

(52) U.S. Cl.
CPC .............. *H01L 41/0986* (2013.01); *F15D 1/12* (2013.01); *G06F 3/016* (2013.01); *G06F 3/045* (2013.01); *Y10T 428/25* (2015.01); *Y10T 428/3154* (2015.04); *Y10T 428/31507* (2015.04); *Y10T 428/31551* (2015.04); *Y10T 428/31663* (2015.04); *Y10T 428/31826* (2015.04); *Y10T 428/31931* (2015.04); *Y10T 428/31935* (2015.04); *Y10T 428/31938* (2015.04)

(58) Field of Classification Search
None
See application file for complete search history.

(56) References Cited

U.S. PATENT DOCUMENTS

| | | |
|---|---|---|
| 2,430,013 A | 11/1947 | Hansell |
| 2,967,914 A | 1/1961 | Pye |
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,539,841 A | 11/1970 | Riff |
| 3,558,936 A | 1/1971 | Horan |
| 3,606,241 A | 9/1971 | Bornholdt |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A | 2/1976 | Ohigashi et al. |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |

(Continued)

FOREIGN PATENT DOCUMENTS

| | | |
|---|---|---|
| CA | 2329804 A1 | 11/1999 |
| CA | 2330384 A1 | 11/1999 |

(Continued)

OTHER PUBLICATIONS

Akle, Barbar J. et al, "Ionic Electroactive Hybrid Transducers", Smart Structures and Materials 2005: Electroactive Polymer Actuators and Devices (EAPAD), Proceedings of SPIE, Bellingham, WA, vol. 5759, pp. 153-164.

(Continued)

*Primary Examiner* — Sheeba Ahmed
(74) *Attorney, Agent, or Firm* — K&L Gates LLP

(57) ABSTRACT

The invention relates to an electro-switchable polymer film assembly having a first and a second surface side, comprising at least one pair of electrodes (3, 4) and a polymer matrix (2), wherein structuring particles (5) can be embedded in the polymer matrix and the polymer matrix or the structuring particles consist of an electro-active polymer, wherein furthermore, the first and/or the second surface sides can be transferred from a plane condition into a structured condition by electric switching of the electro-active polymer.

14 Claims, 4 Drawing Sheets

(56) References Cited

U.S. PATENT DOCUMENTS

Figure 3B:
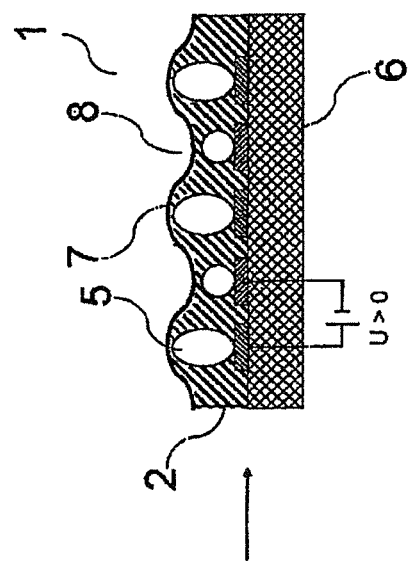

| | | |
|---|---|---|
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A | 11/1980 | Iguchi et al. |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,566,135 A | 1/1986 | Schmidt |
| 4,588,998 A | 5/1986 | Yamamuro et al. |
| 4,592,383 A | 6/1986 | Rikuta |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,668,449 A | 5/1987 | Soni et al. |
| 4,678,955 A | 7/1987 | Toda |
| 4,686,440 A | 8/1987 | Hatamura et al. |
| 4,689,614 A | 8/1987 | Strachan |
| 4,704,556 A | 11/1987 | Kay |
| 4,715,396 A | 12/1987 | Fox |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |
| 4,885,830 A | 12/1989 | Ohtaka |
| 4,904,222 A | 2/1990 | Gastgeb et al. |
| 4,906,886 A | 3/1990 | Breimesser et al. |
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,199,641 A | 4/1993 | Hohm et al. |
| 5,206,557 A | 4/1993 | Bobbio |
| 5,229,979 A | 7/1993 | Scheinbeim et al. |
| 5,232,196 A | 8/1993 | Hutchings et al. |
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim et al. |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Buschulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |

(56) References Cited

U.S. PATENT DOCUMENTS

| | | |
|---|---|---|
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,632,841 A | 5/1997 | Hellbaum et al. |
| 5,636,072 A | 6/1997 | Shibata et al. |
| 5,636,100 A | 6/1997 | Zheng et al. |
| 5,642,015 A | 6/1997 | Whitehead et al. |
| 5,647,245 A | 7/1997 | Takei |
| 5,668,703 A | 9/1997 | Rossi et al. |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aaroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |
| 6,156,842 A | 12/2000 | Hoenig et al. |
| 6,157,528 A | 12/2000 | Anthony |
| 6,161,966 A | 12/2000 | Chang et al. |
| 6,165,126 A | 12/2000 | Merzenich et al. |
| 6,168,133 B1 | 1/2001 | Heinz et al. |
| 6,181,351 B1 | 1/2001 | Merrill et al. |
| 6,184,044 B1 | 2/2001 | Sone et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,190,805 B1 | 2/2001 | Takeuchi et al. |
| 6,194,815 B1 | 2/2001 | Carroll |
| 6,196,935 B1 | 3/2001 | Spangler et al. |
| 6,198,203 B1 | 3/2001 | Hotomi |
| 6,198,204 B1 | 3/2001 | Pottenger |
| 6,201,398 B1 | 3/2001 | Takada |
| 6,210,827 B1 | 4/2001 | Dopp et al. |
| 6,228,533 B1 | 5/2001 | Ohashi et al. |
| 6,232,702 B1 | 5/2001 | Newnham et al. |
| 6,239,535 B1 | 5/2001 | Toda et al. |
| 6,239,536 B1 | 5/2001 | Lakin |
| 6,240,814 B1 | 6/2001 | Boyd et al. |
| 6,248,262 B1 | 6/2001 | Kubotera et al. |
| 6,249,076 B1 | 6/2001 | Madden et al. |
| 6,252,221 B1 | 6/2001 | Kaneko et al. |
| 6,252,334 B1 | 6/2001 | Nye et al. |
| 6,252,336 B1 | 6/2001 | Hall |
| 6,255,758 B1 | 7/2001 | Cabuz et al. |
| 6,262,516 B1 | 7/2001 | Fukuda et al. |
| 6,268,219 B1 | 7/2001 | McBride et al. |
| 6,282,074 B1 | 8/2001 | Anthony |
| 6,284,435 B1 | 9/2001 | Cao |
| 6,286,961 B1 | 9/2001 | Ogawa |
| 6,291,155 B1 | 9/2001 | Raguse et al. |
| 6,291,928 B1 | 9/2001 | Lazarus et al. |
| 6,294,859 B1 | 9/2001 | Jaenker |
| 6,297,579 B1 | 10/2001 | Martin et al. |
| 6,311,950 B1 | 11/2001 | Kappel et al. |
| 6,316,084 B1 | 11/2001 | Claus et al. |
| 6,321,428 B1 | 11/2001 | Toda et al. |
| 6,330,463 B1 | 12/2001 | Hedrich |
| 6,333,595 B1 | 12/2001 | Horikawa et al. |
| 6,334,673 B1 | 1/2002 | Kitahara et al. |
| 6,336,880 B1 | 1/2002 | Agner |
| 6,339,527 B1 | 1/2002 | Farooq et al. |
| 6,343,129 B1 | 1/2002 | Pelrine et al. |
| 6,345,840 B1 | 2/2002 | Meyer et al. |
| 6,349,141 B1 | 2/2002 | Corsaro |
| 6,355,185 B1 | 3/2002 | Kubota |
| 6,358,021 B1 | 3/2002 | Cabuz |
| 6,359,370 B1 | 3/2002 | Chang |
| 6,366,193 B2 | 4/2002 | Duggal et al. |
| 6,369,954 B1 | 4/2002 | Berge et al. |
| 6,375,857 B1 | 4/2002 | Ng et al. |
| 6,376,971 B1 | 4/2002 | Pelrine et al. |
| 6,377,383 B1 | 4/2002 | Whitehead et al. |
| 6,379,393 B1 | 4/2002 | Mavroidis et al. |
| 6,379,809 B1 | 4/2002 | Simpson et al. |
| 6,385,021 B1 | 5/2002 | Takeda et al. |
| 6,385,429 B1 | 5/2002 | Weber et al. |
| 6,388,043 B1 | 5/2002 | Langer et al. |
| 6,388,553 B1 | 5/2002 | Shea et al. |
| 6,388,856 B1 | 5/2002 | Anthony |
| 6,400,065 B1 | 6/2002 | Toda et al. |
| 6,404,107 B1 | 6/2002 | Lazarus et al. |
| 6,411,009 B2 | 6/2002 | Jaenker |
| 6,411,013 B1 | 6/2002 | Horning |
| 6,424,079 B1 | 7/2002 | Carroll |
| 6,429,573 B2 | 8/2002 | Koopmann et al. |
| 6,429,576 B1 | 8/2002 | Simes |
| 6,433,689 B1 | 8/2002 | Hovind et al. |

(56) References Cited

U.S. PATENT DOCUMENTS

| | | |
|---|---|---|
| 6,434,245 B1 | 8/2002 | Zimmermann |
| 6,435,840 B1 | 8/2002 | Sharma et al. |
| 6,436,531 B1 | 8/2002 | Kollaja et al. |
| 6,437,489 B1 | 8/2002 | Shinke et al. |
| 6,457,697 B1 | 10/2002 | Kolze |
| 6,459,088 B1 | 10/2002 | Yasuda et al. |
| 6,471,185 B2 | 10/2002 | Lewin et al. |
| 6,475,931 B2 | 11/2002 | Bower et al. |
| 6,486,589 B1 | 11/2002 | Dujari et al. |
| 6,492,762 B1 | 12/2002 | Pant et al. |
| 6,495,945 B2 | 12/2002 | Yamaguchi et al. |
| 6,499,509 B2 | 12/2002 | Berger et al. |
| 6,502,803 B1 | 1/2003 | Mattes |
| 6,504,286 B1 | 1/2003 | Porat et al. |
| 6,509,802 B2 | 1/2003 | Kasperkovitz |
| 6,514,237 B1 | 2/2003 | Maseda |
| 6,522,516 B2 | 2/2003 | Anthony |
| 6,523,560 B1 | 2/2003 | Williams et al. |
| 6,528,928 B1 | 3/2003 | Burns et al. |
| 6,530,266 B1 | 3/2003 | Adderton et al. |
| 6,532,145 B1 | 3/2003 | Carlen et al. |
| 6,543,110 B1 | 4/2003 | Pelrine et al. |
| 6,545,384 B1 | 4/2003 | Pelrine et al. |
| 6,562,513 B1 | 5/2003 | Takeuchi et al. |
| 6,583,533 B2 | 6/2003 | Pelrine et al. |
| 6,586,859 B2 | 7/2003 | Kombluh et al. |
| 6,590,267 B1 | 7/2003 | Goodwin-Johansson et al. |
| 6,593,155 B2 | 7/2003 | Mohler et al. |
| 6,613,816 B2 | 9/2003 | Mahdi et al. |
| 6,617,759 B1 | 9/2003 | Zumeris et al. |
| 6,617,765 B1 | 9/2003 | Lagier et al. |
| 6,619,799 B1 | 9/2003 | Blum et al. |
| 6,628,040 B2 | 9/2003 | Pelrine et al. |
| 6,631,068 B1 | 10/2003 | Lobo |
| 6,637,276 B2 | 10/2003 | Adderton et al. |
| 6,640,402 B1 | 11/2003 | Vooren et al. |
| 6,644,027 B1 | 11/2003 | Kelly |
| 6,646,077 B1 | 11/2003 | Lyons |
| 6,650,455 B2 | 11/2003 | Miles |
| 6,652,938 B1 | 11/2003 | Nishikawa et al. |
| 6,654,004 B2 | 11/2003 | Hoggarth |
| 6,664,718 B2 | 12/2003 | Pelrine et al. |
| 6,668,109 B2 | 12/2003 | Nahum et al. |
| 6,673,533 B1 | 1/2004 | Wohlstadter et al. |
| 6,680,825 B1 | 1/2004 | Murphy et al. |
| 6,682,500 B2 | 1/2004 | Soltanpour et al. |
| 6,690,101 B2 | 2/2004 | Magnussen et al. |
| 6,700,314 B2 | 3/2004 | Cuhat et al. |
| 6,701,296 B1 | 3/2004 | Kramer et al. |
| 6,707,236 B2 | 3/2004 | Pelrine et al. |
| 6,720,710 B1 | 4/2004 | Wenzel et al. |
| 6,733,130 B2 | 5/2004 | Blum et al. |
| 6,743,273 B2 | 6/2004 | Chung et al. |
| 6,762,050 B2 | 7/2004 | Fukushima et al. |
| 6,768,246 B2 | 7/2004 | Pelrine et al. |
| 6,781,284 B1 | 8/2004 | Pelrine et al. |
| 6,784,227 B2 | 8/2004 | Simon et al. |
| 6,791,205 B2 | 9/2004 | Woodbridge |
| 6,800,155 B2 | 10/2004 | Senecal et al. |
| 6,804,068 B2 | 10/2004 | Sasaki et al. |
| 6,806,621 B2 | 10/2004 | Heim et al. |
| 6,806,806 B2 | 10/2004 | Anthony |
| 6,806,808 B1 | 10/2004 | Watters et al. |
| 6,809,462 B2 | 10/2004 | Pelrine et al. |
| 6,809,928 B2 | 10/2004 | Gwin et al. |
| 6,812,624 B1 | 11/2004 | Pei et al. |
| 6,824,689 B2 | 11/2004 | Wang et al. |
| 6,847,153 B1 | 1/2005 | Balizer |
| 6,847,155 B2 | 1/2005 | Schwartz et al. |
| 6,856,305 B2 | 2/2005 | Nagano |
| 6,864,592 B1 | 3/2005 | Kelly |
| 6,866,242 B2 | 3/2005 | Hirota |
| 6,867,533 B1 | 3/2005 | Su et al. |
| 6,869,275 B2 | 3/2005 | Dante et al. |
| 6,876,135 B2 | 4/2005 | Pelrine et al. |
| 6,879,318 B1 | 4/2005 | Chan et al. |
| 6,882,086 B2 | 4/2005 | Kornbluh et al. |
| 6,891,317 B2 | 5/2005 | Pei et al. |
| 6,902,048 B1 | 6/2005 | Chung |
| 6,911,764 B2 | 6/2005 | Pelrine et al. |
| 6,935,287 B2 | 8/2005 | Shinogle |
| 6,938,945 B2 | 9/2005 | Wald et al. |
| 6,940,211 B2 | 9/2005 | Pelrine et al. |
| 6,940,212 B2 | 9/2005 | Mueller |
| 6,940,221 B2 | 9/2005 | Matsukiyo et al. |
| 6,944,931 B2 | 9/2005 | Shcheglov et al. |
| 6,952,313 B2 | 10/2005 | Schrader |
| 6,967,430 B2 | 11/2005 | Johansson |
| 6,994,314 B2 | 2/2006 | Garnier et al. |
| 6,997,870 B2 | 2/2006 | Couvillon, Jr. |
| 7,008,838 B1 | 3/2006 | Hosking et al. |
| 7,011,378 B2 | 3/2006 | Maluf et al. |
| 7,011,760 B2 | 3/2006 | Wang et al. |
| 7,029,056 B2 | 4/2006 | Browne et al. |
| 7,034,432 B1 | 4/2006 | Pelrine et al. |
| 7,037,270 B2 | 5/2006 | Seward |
| 7,038,357 B2 | 5/2006 | Goldenberg et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,063,268 B2 | 6/2006 | Chrysler et al. |
| 7,063,377 B2 | 6/2006 | Brei et al. |
| 7,064,472 B2 | 6/2006 | Pelrine et al. |
| 7,071,596 B2 | 7/2006 | Krill |
| 7,075,162 B2 | 7/2006 | Unger |
| 7,075,213 B2 | 7/2006 | Krill |
| 7,092,238 B2 | 8/2006 | Saito et al. |
| 7,099,141 B1 | 8/2006 | Kaufman et al. |
| 7,104,146 B2 | 9/2006 | Benslimane et al. |
| 7,109,643 B2 | 9/2006 | Hirai et al. |
| 7,113,318 B2 | 9/2006 | Onuki et al. |
| 7,113,848 B2 | 9/2006 | Hanson |
| 7,115,092 B2 | 10/2006 | Park et al. |
| 7,140,180 B2 | 11/2006 | Gerber et al. |
| 7,141,888 B2 | 11/2006 | Sabol et al. |
| 7,142,368 B2 | 11/2006 | Kim et al. |
| 7,142,369 B2 | 11/2006 | Wu et al. |
| 7,144,616 B1 | 12/2006 | Unger et al. |
| 7,148,789 B2 | 12/2006 | Sadler et al. |
| 7,164,212 B2 | 1/2007 | Leijon et al. |
| 7,166,952 B2 | 1/2007 | Topliss et al. |
| 7,166,953 B2 | 1/2007 | Heim et al. |
| 7,170,665 B2 | 1/2007 | Kaneko et al. |
| 7,190,016 B2 | 3/2007 | Cahalen et al. |
| 7,193,350 B1 | 3/2007 | Blackburn et al. |
| 7,195,393 B2 | 3/2007 | Potter |
| 7,195,950 B2 | 3/2007 | Taussig |
| 7,196,688 B2 | 3/2007 | Schena |
| 7,199,302 B2 | 4/2007 | Raisanen |
| 7,199,501 B2 | 4/2007 | Pei et al. |
| 7,205,704 B2 | 4/2007 | Audren et al. |
| 7,205,978 B2 | 4/2007 | Poupyrev et al. |
| 7,209,280 B2 | 4/2007 | Goossens |
| 7,211,937 B2 | 5/2007 | Kornbluh et al. |
| 7,220,785 B2 | 5/2007 | Saito |
| 7,224,106 B2 | 5/2007 | Pei et al. |
| 7,233,097 B2 | 6/2007 | Rosenthal et al. |
| 7,235,152 B2 | 6/2007 | Bell et al. |
| 7,237,524 B2 | 7/2007 | Pelrine et al. |
| 7,242,106 B2 | 7/2007 | Kelly |
| 7,245,440 B2 | 7/2007 | Peseux |
| 7,256,943 B1 | 8/2007 | Kobrin et al. |
| 7,259,495 B2 | 8/2007 | Asai et al. |
| 7,259,503 B2 | 8/2007 | Pei et al. |
| 7,276,090 B2 | 10/2007 | Shahinpoor et al. |
| 7,291,512 B2 | 11/2007 | Unger |
| 7,298,054 B2 | 11/2007 | Hirsch |
| 7,298,559 B2 | 11/2007 | Kato et al. |
| 7,298,603 B2 | 11/2007 | Mizuno et al. |
| 7,301,261 B2 | 11/2007 | Ifuku et al. |
| 7,310,874 B2 | 12/2007 | Higuchi et al. |
| 7,312,917 B2 | 12/2007 | Jacob |
| 7,320,457 B2 | 1/2008 | Heim et al. |
| 7,321,185 B2 | 1/2008 | Schultz |

(56) References Cited

U.S. PATENT DOCUMENTS

| | | | |
|---|---|---|---|
| 7,323,790 B2 | 1/2008 | Taylor et al. |
| 7,332,688 B2 | 2/2008 | Browne et al. |
| 7,339,285 B2 | 3/2008 | Negron Crespo |
| 7,339,572 B2 | 3/2008 | Schena |
| 7,342,573 B2 | 3/2008 | Ryynanen |
| 7,355,293 B2 | 4/2008 | Bernhoff et al. |
| 7,359,124 B1 | 4/2008 | Fang et al. |
| 7,362,031 B2 | 4/2008 | Maita et al. |
| 7,362,032 B2 | 4/2008 | Pelrine et al. |
| 7,362,889 B2 | 4/2008 | Dubowsky et al. |
| 7,368,862 B2 | 5/2008 | Pelrine et al. |
| 7,371,596 B2 | 5/2008 | Warner, Jr. et al. |
| 7,373,454 B1 | 5/2008 | Noe |
| 7,378,783 B2 | 5/2008 | Pelrine et al. |
| 7,392,876 B2 | 7/2008 | Browne et al. |
| 7,394,182 B2 | 7/2008 | Pelrine et al. |
| 7,394,282 B2 | 7/2008 | Sinha et al. |
| 7,394,641 B2 | 7/2008 | Won et al. |
| 7,397,166 B1 | 7/2008 | Morgan et al. |
| 7,401,846 B2 | 7/2008 | Browne et al. |
| 7,411,332 B2 | 8/2008 | Kornbluh et al. |
| 7,426,340 B2 | 9/2008 | Seo |
| 7,429,074 B2 | 9/2008 | McKnight et al. |
| 7,429,495 B2 | 9/2008 | Wan |
| 7,436,099 B2 | 10/2008 | Pei et al. |
| 7,436,646 B2 | 10/2008 | Delince et al. |
| 7,442,421 B2 | 10/2008 | Li et al. |
| 7,442,760 B2 | 10/2008 | Roberts et al. |
| 7,444,072 B2 | 10/2008 | Seo |
| 7,446,926 B2 | 11/2008 | Sampsell |
| 7,449,821 B2 | 11/2008 | Dausch |
| 7,454,820 B2 | 11/2008 | Nakamura |
| 7,456,549 B2 | 11/2008 | Heim et al. |
| 7,468,575 B2 | 12/2008 | Pelrine et al. |
| 7,481,120 B2 | 1/2009 | Gravesen et al. |
| 7,492,076 B2 | 2/2009 | Heim et al. |
| 7,498,729 B2 | 3/2009 | Ogino |
| 7,499,223 B2 | 3/2009 | Berge et al. |
| 7,511,706 B2 | 3/2009 | Schena |
| 7,513,624 B2 | 4/2009 | Yavid et al. |
| 7,515,350 B2 | 4/2009 | Berge et al. |
| 7,518,284 B2 | 4/2009 | Benslimane et al. |
| 7,521,840 B2 | 4/2009 | Heim |
| 7,521,847 B2 | 4/2009 | Heim |
| 7,537,197 B2 | 5/2009 | Heim et al. |
| 7,548,015 B2 | 6/2009 | Benslimane et al. |
| 7,548,232 B2 | 6/2009 | Shahoian et al. |
| 7,573,064 B2 | 8/2009 | Benslimane et al. |
| 7,585,122 B2 | 9/2009 | Eromaki et al. |
| 7,586,242 B2 | 9/2009 | Yokoyama et al. |
| 7,595,580 B2 | 9/2009 | Heim |
| 7,608,989 B2 | 10/2009 | Heydt et al. |
| 7,626,319 B2 | 12/2009 | Heim |
| 7,646,544 B2 | 1/2010 | Batchko et al. |
| 7,648,118 B2 | 1/2010 | Ukpai et al. |
| 7,659,918 B2 | 2/2010 | Turner |
| 7,679,267 B2 | 3/2010 | Heim |
| 7,679,839 B2 | 3/2010 | Polyakov et al. |
| 7,690,622 B2 | 4/2010 | Ito et al. |
| 7,702,227 B2 | 4/2010 | Ito et al. |
| 7,703,740 B1 | 4/2010 | Franklin |
| 7,703,742 B2 | 4/2010 | Heim et al. |
| 7,703,839 B2 | 4/2010 | McKnight et al. |
| 7,705,521 B2 | 4/2010 | Pelrine et al. |
| 7,714,701 B2 | 5/2010 | Altan et al. |
| 7,732,999 B2 | 6/2010 | Clausen et al. |
| 7,733,575 B2 | 6/2010 | Heim et al. |
| 7,750,532 B2 | 7/2010 | Heim |
| 7,750,617 B2 | 7/2010 | Omi |
| 7,761,981 B2 | 7/2010 | Rosenthal et al. |
| 7,785,656 B2 | 8/2010 | Pei et al. |
| 7,787,646 B2 | 8/2010 | Pelrine et al. |
| 7,813,047 B2 | 10/2010 | Wang et al. |
| 7,824,580 B2 | 11/2010 | Boll et al. |
| 7,886,993 B2 | 2/2011 | Bachmaier et al. |
| 7,893,965 B2 | 2/2011 | Heim et al. |
| 7,898,159 B2 | 3/2011 | Heydt et al. |
| 7,911,115 B2 | 3/2011 | Pelrine et al. |
| 7,911,761 B2 | 3/2011 | Biggs et al. |
| 7,915,789 B2 | 3/2011 | Smith |
| 7,915,790 B2 | 3/2011 | Heim et al. |
| 7,921,541 B2 | 4/2011 | Pei et al. |
| 7,923,064 B2 | 4/2011 | Pelrine et al. |
| 7,923,902 B2 | 4/2011 | Heim |
| 7,923,982 B2 | 4/2011 | Sumita |
| 7,940,476 B2 | 5/2011 | Polyakov et al. |
| 7,952,261 B2 | 5/2011 | Lipton et al. |
| 7,971,850 B2 | 7/2011 | Heim et al. |
| 7,980,671 B2 | 7/2011 | Nystrom et al. |
| 7,986,466 B2 | 7/2011 | Lee et al. |
| 7,990,022 B2 | 8/2011 | Heim |
| 8,004,339 B2 | 8/2011 | Barrow |
| 8,026,023 B2 | 9/2011 | Hamada |
| 8,042,264 B2 | 10/2011 | Rosenthal et al. |
| 8,049,333 B2 | 11/2011 | Alden et al. |
| 8,054,566 B2 | 11/2011 | Heim et al. |
| 8,058,861 B2 | 11/2011 | Pelrine et al. |
| 8,072,121 B2 | 12/2011 | Heim et al. |
| 8,093,783 B2 | 1/2012 | Rosenthal et al. |
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma et al. |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Pelrine et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,679,575 B2 | 3/2014 | Biggs et al. |
| 8,679,621 B2 | 3/2014 | Blaiszik et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 2001/0007449 A1 | 7/2001 | Kobachi et al. |
| 2002/0083858 A1 | 7/2002 | MacDiarmid et al. |
| 2004/0014860 A1 | 1/2004 | Meier et al. |
| 2004/0046739 A1 | 3/2004 | Gettemy |
| 2004/0124738 A1 | 7/2004 | Pelrine et al. |
| 2005/0002113 A1 | 1/2005 | Berge |
| 2005/0046312 A1 | 3/2005 | Miyoshi |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0157893 A1* | 7/2005 | Pelrine et al. ................. 381/190 |
| 2005/0200984 A1 | 9/2005 | Browne et al. |
| 2006/0057377 A1 | 3/2006 | Harrison et al. |
| 2006/0079619 A1 | 4/2006 | Wang et al. |
| 2006/0122954 A1 | 6/2006 | Podlasek et al. |
| 2006/0138371 A1 | 6/2006 | Garnier |
| 2006/0197741 A1 | 9/2006 | Biggadike |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita et al. |
| 2007/0200457 A1 | 8/2007 | Heim et al. |
| 2007/0219285 A1 | 9/2007 | Kropp et al. |

(56) References Cited

U.S. PATENT DOCUMENTS

| | | |
|---|---|---|
| 2007/0230222 A1 | 10/2007 | Drabing et al. |
| 2008/0062589 A1 | 3/2008 | Drabing |
| 2008/0128027 A1 | 6/2008 | Hyde et al. |
| 2008/0143696 A1 | 6/2008 | Goulthorpe |
| 2008/0152921 A1 | 6/2008 | Kropp |
| 2008/0303782 A1 | 12/2008 | Grant et al. |
| 2009/0184606 A1 | 7/2009 | Rosenthal et al. |
| 2009/0250021 A1 | 10/2009 | Zarrabi et al. |
| 2009/0297829 A1 | 12/2009 | Pyles et al. |
| 2010/0236843 A1 | 9/2010 | Englund |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0256383 A1 | 10/2011 | Cochet et al. |
| 2011/0285247 A1 | 11/2011 | Lipton et al. |
| 2014/0014715 A1 | 1/2014 | Moran et al. |
| 2014/0176753 A1 | 6/2014 | Hillis et al. |
| 2014/0290834 A1 | 10/2014 | Egron et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0034237 A1 | 2/2015 | Biggs et al. |
| 2015/0043095 A1 | 2/2015 | Lipton et al. |
| 2015/0070740 A1 | 3/2015 | Zarrabi et al. |
| 2015/0084483 A1 | 3/2015 | Yoo et al. |
| 2015/0096666 A1 | 4/2015 | Yoo et al. |

FOREIGN PATENT DOCUMENTS

| | | |
|---|---|---|
| DE | 2535833 A1 | 2/1977 |
| DE | 4408618 A1 | 9/1995 |
| DE | 19636909 C1 | 3/1998 |
| DE | 19952062 A1 | 5/2000 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |
| EP | 1481467 A1 | 12/2004 |
| EP | 1512215 A1 | 3/2005 |
| EP | 1528609 A2 | 5/2005 |
| EP | 1602135 A2 | 12/2005 |
| EP | 1698876 A2 | 9/2006 |
| EP | 1751843 A2 | 2/2007 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2745476 A1 | 9/1997 |
| GB | 2338513 A | 12/1999 |
| GB | 2470006 A | 11/2010 |
| JP | S5181120 A | 7/1976 |
| JP | S52120840 A | 10/1977 |
| JP | S5445593 A | 4/1979 |
| JP | S5542474 A | 3/1980 |
| JP | S5565569 A | 5/1980 |
| JP | S5661679 A | 5/1981 |
| JP | S56101788 A | 8/1981 |
| JP | S59126689 A | 7/1984 |
| JP | S6199499 A | 5/1986 |
| JP | S61239799 A | 10/1986 |
| JP | S6397100 A | 4/1988 |
| JP | H02162214 A | 6/1990 |
| JP | 02222019 A | 9/1990 |
| JP | 03173022 A | 7/1991 |
| JP | H04353279 A | 12/1992 |
| JP | H05202707 A | 8/1993 |
| JP | H05244782 A | 9/1993 |
| JP | H07111785 A | 4/1995 |
| JP | H07240544 A | 9/1995 |
| JP | H09275688 A | 10/1997 |
| JP | H10137655 A | 5/1998 |
| JP | H10207616 A | 8/1998 |
| JP | H10321482 A | 12/1998 |
| JP | H112764 A | 1/1999 |
| JP | 11134109 A | 5/1999 |
| JP | H11133210 A | 5/1999 |
| JP | 2000-081504 A | 3/2000 |
| JP | 2001-130774 A | 5/2001 |
| JP | 2001-136598 A | 5/2001 |
| JP | 2001-286162 A | 10/2001 |
| JP | 2003-040041 A | 2/2003 |
| JP | 3501216 B2 | 3/2004 |
| JP | 2004-516966 A | 6/2004 |
| JP | 2004-221742 A | 8/2004 |
| JP | 2004-296154 A | 10/2004 |
| JP | 2004-353279 A | 12/2004 |
| JP | 2005-202707 A | 7/2005 |
| JP | 2005-522162 A | 7/2005 |
| JP | 3709723 B2 | 8/2005 |
| JP | 2005-527178 A | 9/2005 |
| JP | 2006-048302 A | 2/2006 |
| JP | 2006-509052 A | 3/2006 |
| JP | 2006-178434 A | 7/2006 |
| JP | 2006-520180 A | 8/2006 |
| JP | 2006-244490 A | 9/2006 |
| JP | 2007-206362 A | 8/2007 |
| JP | 2007-287670 A | 11/2007 |
| JP | 2008-262955 A | 10/2008 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 | 11/2011 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A1 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/27660 A2 | 4/2002 |
| WO | WO 02/37660 A1 | 4/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | 2005079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |

(56) References Cited

FOREIGN PATENT DOCUMENTS

| | | |
|---|---|---|
| WO | WO 2006/102273 A2 | 9/2006 |
| WO | WO 2006/121818 A2 | 11/2006 |
| WO | WO 2006/123317 A2 | 11/2006 |
| WO | WO 2007/029275 A1 | 3/2007 |
| WO | WO 2007/072411 A1 | 6/2007 |
| WO | WO 2008/052559 A2 | 5/2008 |
| WO | 2008105861 A2 | 9/2008 |
| WO | WO 2008/150817 A1 | 12/2008 |
| WO | WO 2009/006318 A1 | 1/2009 |
| WO | WO 2009/076477 A1 | 6/2009 |
| WO | WO 2009/112988 A1 | 9/2009 |
| WO | WO 2010/104953 A1 | 9/2010 |
| WO | WO 2011/118315 A1 | 9/2011 |
| WO | WO 2012/044419 A1 | 4/2012 |
| WO | WO 2012/099854 A1 | 7/2012 |
| WO | WO 2012/118916 A2 | 9/2012 |
| WO | WO 2012/129357 A2 | 9/2012 |
| WO | WO 2012/148644 A2 | 11/2012 |
| WO | WO 2013/055733 A1 | 4/2013 |
| WO | WO 2013/103470 A1 | 7/2013 |
| WO | WO 2013/142552 A1 | 9/2013 |
| WO | WO 2013/155377 A1 | 10/2013 |
| WO | WO 2013/192143 A1 | 12/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/066576 A1 | 5/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/051291 A1 | 4/2015 |

OTHER PUBLICATIONS

Chen, Zheng et al, "Quasi-static Positioning of Ionic Polymer-Metal Composite (IPMC) Actuators", Proceedings of the 2005 IEEE/ASME International Conference on Advanced Intelligent Mechatronics, Monterey, California, Jul. 24-28, 2005, pp. 60-65.
Huang, Cheng et al, "Colossal Dielectric and Electromechanical Responses in Self-assembled Polymeric Nanocomposites", Applied Physics Letters 87, 182901 (2005), pp. 182901-1 through 182901-3.
U.S. Appl. No. 14/440,991, filed May 6, 2015.
U.S. Appl. No. 14/437,741, filed Apr. 22, 2015.
U.S. Appl. No. 14/421,448, filed Feb. 13, 2015.
U.S. Appl. No. 14/421,450, filed Feb. 13, 2015.
U.S. Appl. No. 14/421,452, filed Feb. 13, 2015.
U.S. Appl. No. 14/435,761, filed Apr. 15, 2015.
U.S. Appl. No. 14/649,743, filed Jun. 4, 2015.
Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.
Anderson, R.A., "Mechanical Stress in a Delectric Solid From a Uniform Electric Field," The American Physical Society, 1986, pp. 1302-1307.
Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.
Ashley, S., "Artificial Muscles", Scientific American 2003, pp. 53-59.
Ashley, S., "Smart Skis and Other Adaptive Structures," Mechanical Engineering, Nov. 1995, pp. 77-81.
Bar-Cohen, Yoseph, JPL, WorldWide ElectroActive Polymers, EAP (Artifical Muscles) Newsletter, vol. 1, No. 1, Jun. 1999.
Bar-Cohen, Yoseph, JPL, WorldWide ElectroActive Polymers, EAP (Artifical Muscles) Newsletter, vol. 1, No. 2, Dec. 1999.
Bar-Cohen, Yoseph, JPL, WorldWide ElectroActive Polymers, EAP (Artifical Muscles) Newsletter, vol. 2, No. 1, Jul. 2000.
Bar-Cohen, Yoseph, JPL, WorldWide ElectroActive Polymers, EAP (Artifical Muscles) Newsletter, vol. 2, No. 2, Dec. 2000.
Bar-Cohen, Yoseph, JPL, WorldWide ElectroActive Polymers, EAP (Artifical Muscles) Newsletter, vol. 3, No. 1, Jun. 2001.
Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).
Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.
Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).
Beckett, J., "New Robotics Tap the Mind, Help the Heart, SRI shows of latest technologies," San Francisco Chronicle, Aug. 27, 1998.
Begley, M. et al., "The Electro-Mechanical Response to Highly Compliant Substrates and Thin Stiff Films with Periodic Cracks," International Journal of Solids and Structures, 42:5259-5273, 2005.
Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.
Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).
Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).
Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).
Bharti, V.,X.-Z. Zhao, Q.M. Zhang, T. Rornotowski, F. Tito, and R. Ting, "Ultrahigh Field Induced Strain and Polarization Response in Electron Irradiated Poly(Vinylidene Fluoride-Trifluoroethylene) Copolymer,"Mat. Res. Innovat. vol. 2, pp. 57-63 (1998).
Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.
Bohon, K. And S. Krause, "An Electrorheological Fluid and Siloxane Gel Based Electromechanical Actuator: Working Toward an Artificial Muscle," to be published in J. Polymer Sci., Part B. Polymer Phys. (2000).
Boyle, W. et al., "Departure from Paschen's Law of Breakdown in Gases," The Physical Review, Second Series, 97(2): 255-259, Jan. 15, 1955.
Brock, D.L., "Review of Artifical Muscle based on Contractile Polymers," MIT Artificial Intelligence Laboratory, A.I. Memo No. 1330, Nov. 1991.
Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).
Calvert, P. And Z. Liu, "Electrically Stimulated Bilayer Hydrogels as Muscles," Proceedings of the SPIE International Symposium on Smart Structures and Materials: Electro-Active Plymer Actuators and Devices, Mar. 1-2, 1999, Newport Beach, California, USA, pp. 236-241.
Chen et al., "Active control of low-frequency sound radiation from vibrating panel using planar sound sources," Journal of Vibration and Acoustics, vol. 124, pp. 2-9, Jan. 2002.
Cheng, Z.-Y., H.S. Xu, J. Su, Q. M. Zhjang, P.-C. Wang and a.G. MacDiarmid, "High Performance of All-Polymer Electrostrictive Systems," Proceedings of the SPIE Ineternational Symposium on

(56) References Cited

OTHER PUBLICATIONS

Smart Structures and Materials: Electro-Active Polymer Actuators and Devices, Mar. 1-2, 1999, Newport Beach, California, USA, pp. 140-148.
Cheng, Z.-Y., T.-B. Xu, V. Bharti, S. Wang, and Q.M. Zhang, "Transverse Strain Responses in the Electrostrictive Poly(Vinylidene Fluoride-Trifluorethylene) Copolymer," Appl. Phs. Lett. vol. 74, No. 13, pp. 1901-1903, Mar. 29, 1999.
Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.
De Rossi, D., and P. Chiarelli, "Biomimetic Macromolecular Actuators," Macro-Ion Characterization, American Chemical Society Symposium Series, vol. 548, Ch. 40, pp. 517-530 (1994).
Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen," Proceedings of SPIE, 6168 (6168Q), 2006.
Dowling, K., Beyond Faraday-NonTraditional Actuation, available on the World Wide Web at http://www.frc.ri.cmu.edu/~nivek/OTH/beyond-faraday/beyondfaraday.html, 9 pages, 1994.
Egawa, S. And T. Higuchi, "Multi-Layered Electrostatic Film Actuator," Proc. IEEE Micro Electra Mechanical Systems, Napa Valley, California, pp. 166-171 (Feb. 11-14, 1990).
Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.
Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Systems, vol. 1, No. 1, pp. 44-51 (Mar. 1992); also published as MIT AI Laboratory Memo 1269, Massachusetts Institute of Technology (Feb. 1991).
Ford, V. And J. Kievet, "Technical Support Package on Traveling-Wave Rotary Actuators", NASA Tech Brief, vol. 21, No. 10, Item #145, from JPL New Technology Report NPO-19261, Oct. 1997.
Full, R.J. And K. Meijer, "Artificial Muscles Versus Natural Actuators from Frogs to Flies," Proceedings of the 7th SPIE Symposium on Smart Structures and Materials-Electroactive Polymers and Devices (EAPAD) Conference, Mar. 6-8, 2000, Newport Beach, California, USA, pp. 2-9.
Furuhata, T., T. Hirano, and H. Fujita, "Array-Driven Ultrasonic Microactuators," Solid State Sensors and Actuators, 1991, Digest of Tech. Papers, Transducers, pp. 1056-1059.
Furukawa, T. And N. Seo, "Electrostriction as the Origin of Piezoelectricity in Ferroelectric Polymers," Japanese J. Applied Physics, vol. 29, No. 4, pp. 675-680 (Apr. 1990).
Ghaffarian, S.R., et al., "Electrode Structures in High Strain Actuator Technology," Journal of Optoelectronics and Advanced Materials, Nov. 2007, 9(11), pp. 3585-3591.
Gilbertson, R.G. And J.D. Busch. "Survey of MicroActuator Technologies for Future Spacecraft Missions," presented a the conference entitled "Practical Robotic Interstellar Flight: Are We Ready?" New York University and the United Nations, New York. (Aug. 29 and Sep. 1, 1994); also published on the World Wide Web at http://nonothinc.com/nanosci/microtech/mems/ten-actuators/gilbertson.html.
Goldberg, Lee, "Adaptive-Filtering Developments Extend Noise-Cancellation Applications," Electronic Design, Feb. 6, 1995, pp. 34 and 36.
Greene, M. J.A. Willett, and R. Kornbluh, "Robotic Systems," in ONR Report 32198-2, Ocean Engineering and Marine Systems 1997 Program (Dec. 1997).
Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.
Hansen, G., "High Aspect Ratio Sub-Micron and Nano-Scale Metal Filaments," SAMPE Journal, 41(2): 24-33, 2005.
Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).
Heydt, R., R. Kornbluh, R. Pelrine, and B. Mason, "Design and Performance of an Electrostrictive Polymer Film Acoustic Actuator," Journal of Sound and Vibration (1998) 215(2), 297-311.
Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.
Hirose, S., Biologically Inspired Robots: Snake-like Locomotors and Manipulators, "Development of the ACM as a Manipulator," Oxford University Press, New York, 1993, pp. 170-172.
http://www.neurosupplies.com/pdf_files/transducers.pdf, printed from web Jul. 25, 2001.
Hunter, I., S. Lafontaine, J. Hollerbach, and P. Hunter, "Fast Reversible NiTi Fibers for Use in MicroRobotics," Proc. 1991 IEEE Micro Electro Mechanical Systems-MEMS '91, Nara, Japan, pp. 166-170.
Hunter, I.W. And S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.
Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.
Joseph, J., R. Pelrine, J. Eckerle, J. Bashkin, and P. Mulgaonkar, "Micro Electrical Composite Sensor", SRI International, printed from web Jul. 25, 2001.
Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.
Kawamura, S., K. Minani, and M. Esashi, "Fundamental Research of Distributed Electrostatic Micro Actuator," Technical Digest of the 11th Sensor Symposium, pp. 27-30 (1992).
Khuri-Yakub et al., "Silicon micromachined ultrasonic transducers," Japan Journal of Applied Physics, vol. 39 (2000), pp. 2883-2887, Par 1, No. 5B, May 2000.
Kinsler et al., Fundamentals of Acoustics, Third Edition, John Wiley and Sons, 1982.
Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.
Kornbluh, R., R. Pelrine, R. Heydt, and Q. Pei, "Acoustic Actuators Based on the Field-Activated Deformation of Dielectric Elastomers," (2000).
Kornbluh, R., G. Andeen, and J. Eckerle, "Artificial Muscle: The Next Generation of Robotic Actuators," presented at the Fourth World Conference on Robotics Research, SME Paper M591331, Pittsburgh, PA, Sep. 17-19, 1991.
Kornbluh, R., R. Pelrine, J. Joseph, "Elastonneric Dielectric Artificial Muscle Actuators for Small Robots," Proceedings of the Third IASTED International Conference on Robotics and Manufacturing, Jun. 14-16, 1995, Cancun, Mexico.
Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.
Kornbluh, R. et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.
Kornbluh et al., "Electrostrictive Polymer Artificial Muscle Actuators," May 1998, Proc. Of the 1998 IEEE Conf. On Robotics & Automation, 2147-2154.
Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.

(56) References Cited

OTHER PUBLICATIONS

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.

Kornbluh et al., "Medical Applications of New Electroactive Polymer Artificial Muscles," SRI International, Menlo Park, CA, JSPP, v. 16, 2004.

Kornbluh, R., "Presentation to Colin Corporation", Jan. 1997.

Kornbluh, R. "Presentation to Medtronic", Jan. 2000.

Kornbluh, Roy D., Robotic Systems, Ocean Engineering and Marine Systems, 2000 Program, Jan. 2001, Office of Naval Research Public Release, ONR-32100-1.

Kornbluh, Roy D., Robotic Systems, Ocean Engineering and Marine Systems, 1999 Program, Feb. 2000, Office of Naval Research Public Release, ONR-32100-2.

Kornbluh, Roy D., Robotic Systems, Ocean Engineering and Marine Systems, 1998 Program, Feb. 1999, Office of Naval Research Public Release, ONR-32199-4.

Kornbluh, Roy D., Robotic Systems, Ocean Engineering and Marine Systems, 1997 Program, Dec. 1997, Office of Naval Research Public Release, ONR-32198-2.

Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, R., Pe!rine, R. Joseph, J., Pei, Q. And Chiba., "Ultra-High Strain Response of Elastomeric Polymer Dielectrics", Proc. Materials Res. Soc., Fall meeting, Boston, MA, pp. 1-12, Dec. 1999.

Kornbluh, R., Pelrine, R., Eckerie, J., Joseph, J., "Electrostrictive Polymer Artificial Muscle Actuators," IEEE International Conference on Robotic and Automation, Leuven, Belgium, 1998.

Kornbluh, R., "Use of Artificial Muscle Butterfly for Chronicle Newpaper Photograph," Aug. 1998.

Ktech's PVDF Sensors, http://www.ktech.com/pvdf.htm, Jun. 6, 2001, pp. 1-5.

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.

Lacour, S. et al., "Mechanisms of Reversible Stretchability of Thin Metal Films on Elastomeric Substrates, "Applied Physics Letters 88, 204103, 2006.

Lacour, S. et al., "Stretchable Interconnects for Elastic Electronic Surfaces," Proceedings of the IEEE on Flexible Electronics Technology, 93(8): 1459-1467, 2005.

Lakes, R.S., "Extreme damping in compliant composites with a negative stiffness phase" or "Extreme Damping in Composite Materials with Negative Stiffness Inclusions", Nature, 410, 565-567, Mar. (2001).

Lakes, R.S., "Extreme damping in compliant composites with a negative stiffness phase", Philosophical Magazine Letters, 81, 95-100 (2001).

Lakes, R.S., "Extreme damping in compliant composites with a negative stiffness phase" or "Extreme Damping in Composite Materials with a Negative Stiffness Phase", Physical Review Letters, 86, 2897-2900, Mar. 26 (2001).

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. And R. Arenz, "Miniature Solid-state Gas Compressor," Rev. Sci Instrum., 58(8), pp. 1487-1493, Aug. 1987.

Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA, pp. 186-190.

Liu, C. & Y. Bar-Cohen, "Scaling Laws of Microactuators and Potential Aplications of Elecroactive Polymers in MEMS", SPIE, Conference on Electroactive Polymer Actuators and Devices, Newport Beach, CA Mar. 1999.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

Madden et al., "Conducting polymer actuators as engineering materials," SPIE: Smart Materials and Structures, ed. Yoseph Bar-Cohen, Bellingham, WA, pp. 176-190, Pub 2002.

Madden, J.D. et al., "Fast contracting polypyrrole actuators", Jan. 6, 2000, Elsevier Science S.A., pp. 185-192.

Martin, J. And R. Anderson, 1999. "Electrostriction in Field-Structured Composites: Basis for a Fast Artificial Muscle?", The Journal of Chemical Physics, vol. 111, No. 9, pp. 4273-4280, Sep. 1, 1999.

Measurements Specialties, Inc.-Piezo Home, http://www.msiusa.com/piezo/index.htm, Jun. 6, 2001.

Möller, S. et al., A Polymer/semiconductor write-once read-many-times memory, Nature, vol. 26, Nov. 13, 2003, pp. 166-169, Nature Publishing Group.

Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Nihon Kohden Corporation, Operators Manual, available Oct. 1, 2001.

NXT plc, Huntingdon, UK (www.nxtsound.com) Sep. 17, 2008.

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Osterbacka, R. et al., "Two-Dimensional Electronic Excitations in Self-Assembled Conjugated Polymer Nanocrystals," Science, vol. 287:839-842, Feb. 4 2000.

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Otero, T.F., J. Rodriguez, E. Angulo and C. Santamaria, "Artificial Muscles from Bilayer Structures," Synthetic Metals, vol. 55-57, pp. 3713-3717 (1993).

Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.

Pei, Q., 0. Inganäs, and I. Lundström, "Bending Bilayer Strips Built From Polyaniline for Artificial Electrochemical Muscles," Smart Materials and Structures, vol. 2, pp. 1-6., Jan. 22, 1993.

Pei, Qibing "Description of Conference Demonstration" Mar. 2001.

Pei et al., "Electrochemical Applications of the Bending Beam Method. 1. Mass Transport and vol. Changes in Polypyrrole During Redox," J. Phys. Chem., 1992, 96, pp. 10507-10514.

Pei, Q. et al., "Multifunctional Electroelastomer Roll Actuators and Their Application for Biomimetic Walking Robots," Smart Structures and Materials 2003. Electroactive Polymer Actuators and

(56) References Cited

OTHER PUBLICATIONS

Devices, San Diego, CA, USA, Mar. 3-6, 2003, vol. 5051, 2003, pp. 281-290, XP002291729, Proceedings of the SPIE, ISSN: 0277-786X, the whole document.
Pei, Q. et al., "Multifunctional Electroelastomer Rolls," Mat. Res. Soc. Symp. Proc., vol. 698, Nov. 26-30, 2001, Boston, MA, pp. 165-170.
Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.
Pei, Q. et al., "Recent Progress on Electroelastomer Artificial Muscles and Their Application for Biomimetic Robots", SPIE, Pub. Jun. 2004, 11 pages.
Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.
Pelrine, R., R. Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.
Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.
Pelrine, R., R. Kornbluh, and J. Joseph, FY 1992 Final Report on Artifical Muscle for Small Robots, ITAD-3393-FR-93-063, SRI International, Menlo Park, California, Mar. 1993.
Pelrine, R., R. Kornbluh, and J. Joseph, FY 1993 Final Report on Artifical Muscle for Small Robots, ITAD-4570-FR-94-076, SRI International, Menlo Park, California, 1994.
Pelrine, R., R. Kornbluh, and J. Joseph, FY 1994 Final Report on Artifical Muscle for Small Robots, ITAD-5782-FR-95-050, SRI International, Menlo Park, California, 1995.
Pelrine, R., R. Kornbluh, and J. Joseph, FY 1995 Final Report on Artifical Muscle for Small Robots, ITAD-7071-FR-96-047, SRI International, Menlo Park, California, 1996.
Pelrine, R., R. Kornbluh, and J. Joseph, FY 1996 Final Report on Artifical Muscle for Small Robots, ITAD-7228-FR-97-058, SRI International, Menlo Park, California, 1997.
Pelrine, R., R. Kornbluh, and J. Joseph, FY 1997 Final Report on Artifical Muscle for Small Robots, ITAD-1612-FR-98-041, SRI International, Menlo Park, California, 1998.
Pelrine, R., R. Kornbluh, and J. Joseph, FY 1998 Final Report on Artifical Muscle for Small Robots, ITAD-3482-FR-99-36, SRI International, Menlo Park, California, 1999.
Pelrine, R., R. Kornbluh, and J. Joseph, FY 1999 Final Report on Artifical Muscle for Small Robots, ITAD-10162-FR-00-27, SRI International, Menlo Park, California, 2000.
Pelrine, R., R. Kornbluh, Q. Pei, and J. Joseph, "High Speed Electrically Actuated Elastomers with Over 100% Strain," Science, vol. 287, No. 5454, pp. 1-21, 2000.
Pelrine, R., R. Kornbluh, Q. Pei, and J. Joseph. "High-Speed Electrically Actuated Elastomers, with Strain Greater Than 100%", Science, Reprint Series, Feb. 4, 2000, vol. 287, pp. 836-839.
Pelrine, R., R. Kornbluh, and G. Kofod, "High Strain Actuator Materials Based on Dielectric Elastomers," submitted to Advanced Materials (May 2000).
Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.
Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.
Pelrine, R. And Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.

Piezoflex(TM) PVDF Polymer Sensors, http://www.airmar.com/piezo/pvdf.htm. Jun. 6, 2001.
PowerLab ADInstruments, MLT001 High-Sensitivity Force Transducers, AD Instruments Transducers Series, printed from web Jul. 25, 2001.
Puers et al, "A Capacitive Pressure Sensor with Low Impedance Output and Active Suppression of Parasitic Effects," Sensors and Actuators, A21-A23 (1990) 108-114.
Puers, Robert, "Capacitive sensors: when and how to use them," Sensors and Actuators A, 37-38 (1993) 93-105.
Reed, C. et al., "The Fundamentals of Aging Hv Polymer-Film Capacitors," IEEE Transactions on Dielectrics and Electrical Insulation, 1(5): 904-922, 1994.
Sakarya, S., "Micronnachining Techniques for Fabrication of Integrated Light Modulting Devices", Netherlands 2003, pp. 1-133.
Scheinbeim, J., B. Newman, Z. Ma, and J. Lee, "Electrostrictive Response of Elastomeric Polymers," ACS Polymer Preprints, 33(2), pp. 385-386, 1992.
Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.
Shahinpoor, M., "Micro-electro-mechanics of Ionic Polymer Gels as Electrically Controllable Artificial Muscles," J. Intelligent Material Systems and Structures, vol. 6, pp. 307-314, May 1995.
Shkel, Y. And D. Klingenberg, "Material Parameters for Electrostriction," J. Applied Physics, vol. 80(8), pp. 4566-4572, Oct. 15, 1996.
Smela, E., 0. Inganas, and I. Lundstrom, "Controlled Folding of Micrometer-size Structures," Science, vol. 268, pp. 1735-1738 (Jun. 23, 1995).
Smela, E., O. Inganas, Q. Pei and I. Lundstrom, "Electrochemical Muscles: Micromachinging Fingers and Corkscrews," Advanced Materials, vol. 5, No. 9, pp. 630-632, Sep. 1993.
Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.
Sommer-Larsen, P. and A. Ladegaard Larsen, "Materials for Dielectric Elastomer Actuators," SPIE, vol. 5385, Mar. 1, 2004, pp. 68-77.
Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.
Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials-Electroactive Polymers and Devices (EAPAD) Conference, Mar. 6-8, 2000, Newport Beach, CA, USA, pp. 65-72.
Suzuki et al., "Sound radiation from convex and concave domes in infinite baffle," Journal of the Acoustical Society of America, vol. 69(2), Jan. 1981.
Sokolova, M. et al., "Influence of a Bias Voltage on the Characteristics of Surface Discharges in Dry Air," Plasma Processes and Polymers, 2: 162-169, 2005.
Standard Test Methods for Rubber Deterioration—Cracking in an Ozone Controlled Environment, ASTM International, D 1149-07.
Technology, http://www.micromuscle.com/html/technology.html, Jun. 6, 2001.
"The Rubbery Ruler", http://www.ph.unimelb.edu.au, printed from web Jul. 25, 2001.
Tobushi, H., S. Hayashi, and S. Kojima, "Mechanical Properties of Shape Memory Polymer of Polyurethane Series," in JSME International Journal, Series I, vol. 35, No. 3, 1992.
Todorov et al, "WWWeb Application for Ferropiezoelectric Ceramic Parameters Calculation", Proceedings 24th International Conference on Microelectronics, vol. 1, May 2004, pp. 507-510.
Treloar, L.R.G., "Mechanics of Rubber Elasticity," J Polymer Science, Polymer Symposium, No. 48, pp. 107-123, 1974.
Uchino, K. 1986. "Electrostrictive Actuators: Materials and Applicaions," Ceramic Bulletin, 65(4), pp. 647-652, 1986.
Unger et al. (2000), "Monolithic Microfabricated Valves and Pumps by Multilayer Soft Lithography," Science 288:113-116, no month.

(56) References Cited

OTHER PUBLICATIONS

Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).

Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.

Whitesides et al. (2001), "Flexible Methods for Microfluidics," Physics Today 52(6):42-47, no month.

Winters, J., "Muscle as an Actuator for Intelligent Robots," Robotics Research: Trans. Robotics International of SME, Scottsdale, AZ (Aug. 18-21, 1986).

Woodard, Improvements of ModalMax High-Fidelity Peizoelectric Audio Device (LAR-16321-1), NASA Tech Briefs, May 2005, p. 36.

Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.

Yam, P., "Plastics Get Wired," Scientific American, vol. 273, pp. 82-87, Jul. 1995.

Yoshio, O., "Ablation Characteristics of Silicone Insulation," Journal of Polymer Science: Part A: Polymer Chemistry, 36: 233-239, 1998.

Yuan, W. et al. "New Electrode Materials for Dielectric Elastomer Actuators, " Proc. SPIE, 6524 (65240N), 2007.

Zhang, Q.M., V. Bharti, Z.Y. Cheng, T.B. Xu, S. Wang, T.S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.

Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.

Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).

Zhenyi, M., J.I. Scheinbeim, J.W. Lee, and B.A. Newman. 1994. "High Field Electrostrictive Response of Polymers," Journal of Polymer Sciences, Part B-Polymer Physics, vol. 32, pp. 2721-2731, 1994.

\* cited by examiner

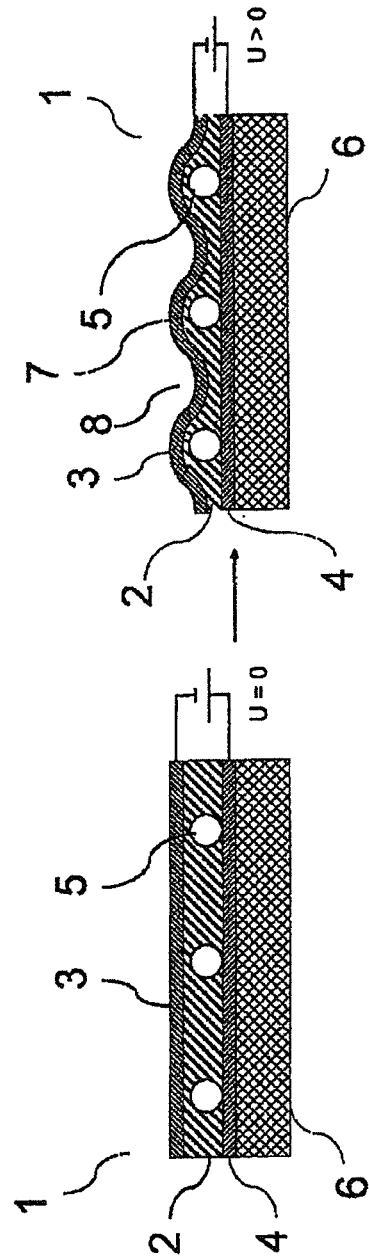

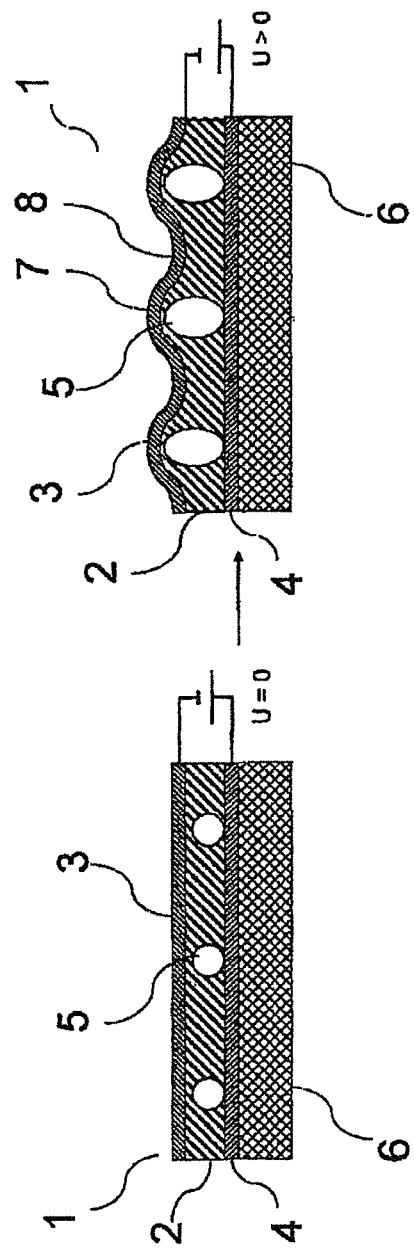

ELECTRO-SWITCHABLE POLYMER FILM ASSEMBLY AND USE THEREOF

The present invention relates to an electrically switchable polymer film arrangement in which a first and/or second surface side of the polymer film arrangement can be converted actively from a smooth state (state before applying an electrical voltage) into a structured state (state after applying an electrical voltage) by electrical switching of an electroactive polymer. The invention furthermore relates to the use of such electrically switchable polymer film arrangements.

The ability to influence a surface structure actively is of great technical interest for various applications, for example variable haptics, optical properties or influencing the flow behaviour of fluids. By virtue of advantageous and controllably adjustable properties, for example low weight and adjustable mechanical properties, polymers and polymer composites are already used in a multiplicity of commercial applications. Functional polymers are gaining importance to an increasing extent as active components in sensor or actuator applications. In this context, the class of electroactive polymers (EAP) has increasingly been at the focus of research in recent years.

Patent specifications US 2008/0128027 A1 and WO 2008/105861 A2 describe systems and methods for the deformation of surfaces, in order to influence the flow of fluids along them in a controlled way. In this way, for example, turbulence can be avoided or resonant oscillations generated or negated. As actuators, inter alia microelectromechanical systems, piezoelectric transducers, electroactive polymers, magnetic or hydraulic actuators are mentioned. The actuators act perpendicularly to the surface and are controlled by means of a control system.

A flat actuator having a plurality of actuator elements, which are made of shape memory wires and/or piezoelectric elements, is proposed in EP 1 090 835 A1. These flat actuators can be used to deliberately influence a flow along a surface. Despite the small ratio between the actuator length and the achievable excursion, and the disposition of the wires parallel to the surface, a small deformation is achieved which can be amplified by a resilient and anisotropically stiffened flat structure. Surface structuring by grooves or slits in the active direction of the actuator elements is additionally proposed, in order to further increase the deformation by the actuators.

DE 100 26 264 A1 discloses a mobile configuration of vehicle outer skins, a multiplicity of narrowly separated, electrically operable actuators in the form of small cylinders being embedded in the outer skin so that the surfaces of the actuators in the starting state extend flush with the outer skin and generate a pimple structure by switching. This pimple structure is intended to lower the air resistance above a certain speed and reduce wind noise, or alternatively be used to detach ice and snow from the outer skin. To this end, polymers and/or ion-exchange materials are proposed as materials for the actuator elements, which undergo a shape change by electrical processes or by changing the pH, the moisture content or the temperature.

Another possible way to generate surface structuring is described in WO 2005/079187 A2. This consists in using the electrostatic attraction between plate-shaped electrodes. Between the electrodes, there is a dielectric elastomer on which a force is exerted by the mutually attracting electrodes when a voltage is applied. The elastomer is then pressed out between the electrodes, so that the surface has a depression in this region. Outside the electrodes, the displaced polymer is squeezed and pressed out of the surface plane. This process creates depressions and elevations, which can lead to particular surface structuring by a predetermined electrode disposition and interconnection. Three-dimensional and in particular Braille displays, mobile mirrors, influencing the flow on wings, stepper motors and pumps are mentioned as applications.

U.S. Pat. No. 7,397,166 B1 describes a peristaltic pump in which the deformation of actuators made of a polymer-metal composite with an applied voltage is used, and by disposing mutually separated electrodes along the longitudinal direction of a flexible tube, a quantity of liquid can be transported inside the tube by successive switching of the electrodes. The transport of liquid medicaments in the human body is mentioned as an example of an application.

EP 1 843 406 A1 discloses an actuator comprising an electroactive polymer. In this polymer matrix, (ceramic) particles are incorporated. These particles are used to increase the dielectric constant $\in$ of the polymer matrix. The actuator disclosed in EP 1 843 406 A1 is capable of adjusting the roughness of a surface. The (ceramic) particles have no physical/mechanical effect, in so far as they influence the roughness of the surface by their individual volume, their size, strength, shape and/or roughness.

Electroactive polymers (EAP) can in principle be subdivided into two main groups. The first group comprises so-called field-activated polymers. Field-activated EAPs are typically polymers, polymer mixtures and polymer composites which are capable of being switched directly by applying an electric field. They require electric fields of up to 200 $V \cdot \mu m^{-1}$. One advantage of the field-activated EAP group is that they can generally be switched with speeds in the millisecond range. Field-activated polymers include dielectric elastomers, ferroelectric polymers, piezoelectric polymers and electrostrictive polymers.

The second main group of EAPs comprises so-called ionic electroactive polymers. This group is distinguished in that it is based on an action mechanism which involves diffusion of ions and/or solvated ions and/or solvent molecules. Examples of polymeric materials which are included among ionic EAPs are polymers or polymer composites which contain mobile ions, conductive polymers, ionic gels and polymer composites with carbon nanotubes and/or graphenes.

The basic types and action mechanisms of the various electroactive polymers (EAP) are described inter alia in the articles in MRS Bulletin, March 2008, Volume 33, No. 3 and the literature respectively cited therein.

Ionic EAPs are usually bound to a liquid medium, for example an electrolyte, and are therefore often dependent on the ambient conditions such as temperature and relative humidity. Without further measures, they can dry out over time in air and thus lose their functionality as EAPs. EAP systems which reduce the dependency on ambient conditions are therefore of interest. One possibility consists in using ionic liquids (IL) as an electrolyte solution in a polymer matrix, so that the overall system consisting of the polymer matrix and ionic liquid is a solid body. ILs are organic salts which exist in the molten state at room temperature, have a negligibly low vapour pressure and can therefore prevent drying-out and function loss of ionic EAPs.

Functional polymers and polymer film arrangements are of increasing interest for commercial applications, for example for sensor and actuator systems, as well as for actively influencing surfaces and surface properties.

The invention therefore provides an electrically switchable polymer film arrangement which has a first surface side and a second surface side which are disposed opposite one another. The polymer film arrangement comprises at least one electrode pair consisting of an anode and a cathode and a polymer matrix, and structuring particles may be disposed in the polymer matrix.

The presence of structuring particles may be preferred according to the invention. However, embodiments which do not contain any such structuring particles may also be preferred according to the invention.

The polymer matrix and/or the optionally provided structuring particles consist of an electroactive polymer. By electrically switching the electroactive polymer, the first and/or second surface side can be converted from a smooth state into a structured state.

In other words, by applying an electrical voltage to a polymer film arrangement according to the invention, a structured surface with elevations and depressions can advantageously be generated actively on at least one surface side. This structuring of at least one surface side of the polymer film arrangement is reversible, and can advantageously be induced repeatedly by further electrical switching. According to the invention, the polymer matrix is configured as a polymer film.

The actively influenceable surface side of the polymer film arrangement according to the invention may, for example, be used to generate haptically perceptible signals and employ the actively generatable roughening by the electrical switching in many applications. Another advantage is that optical effects can also be achieved by the electrical switching of a polymer film arrangement according to the invention. For example, the polymer film arrangement may be transparent in the unswitched, smooth state and opaque after applying a voltage.

Equally, according to the invention, the polymer film arrangements in alternative embodiments may contain a field-activated or an ionic electroactive polymer as an electroactive polymer (EAP).

For example, a field-activated polymer may be selected from dielectric elastomers, ferroelectric polymers, electrostrictive polymers and piezoelectric polymers.

As ferroelectric and piezoelectric polymers, according to the invention for example poly(vinylidene fluoride) (PVDF) and copolymers of VDF, for example copolymers of VDF with trifluoroethylene, may be used. The dielectric elastomers may according to the invention be for example silicones, polyurethanes, polyacrylates, rubbers, styrene-ethylene-butylene-styrene (SEBS) or styrene-butadiene rubber.

The ionic electroactive polymer may according to the invention be selected for example from polymers which contain mobile ions, conductive polymers, ionic gels and polymer composites with carbon nanotubes and/or graphenes.

One example of an ionic gel is poly(vinyl alcohol) gel with dimethyl sulfoxide. Conductive polymers which may be used according to the invention are for example polypyrroles, polyanillines and polythiophenes.

Suitable EAP materials and their action mechanisms are known in principle and described, for example, in the article by Y. Bar-Cohen, Q. Zhang, pp. 173-181, MRS Bulletin, March 2008, Volume 33, No. 3, and in the literature respectively cited therein.

The many alternative selection possibilities in relation to the EAP can advantageously make it possible to adjust the basic properties of the switchable polymer arrangement according to the invention and advantageously allow special adaptation to particular applications. According to the invention, good switchabilities and surface structurings of the first and/or second surface side of the polymer film arrangement according to the invention can be achieved.

The polymer film arrangement according to the invention, comprising at least one electrode pair, a polymer matrix and, optionally, structuring particles embedded therein, may in the unswitched smooth state, i.e. without an applied voltage, have a thickness of $\geq 10$ μm and $\leq 1$ mm, preferably a thickness of from $\geq 50$ to $\leq 500$ μm, particularly preferably $\geq 100$ to $\leq 300$ μm. A particularly suitable thickness of the polymer film arrangement may advantageously be selected respectively as a function of the material specifically used for the polymer matrix and for the particles, particularly with regard to the chosen EAP or EAPs, and with regard to the respectively desired application. The diameter of the structuring particles, if present, is from 50 to 90% of the thickness of the polymer film arrangement, preferably from 70 to 80% of the thickness of the polymer film arrangement.

According to the invention, it is advantageously possible to influence the manifestation of the structuring by a wide variety of parameters. Examples which may be mentioned for such parameters are the strength of the applied electric field, the dimensioning, shape and structuring of the electrodes, size and volume fraction of the particles and thickness of the polymer matrix.

In another configuration of the electrically switchable polymer film arrangement according to the invention, the electrodes, i.e. the anode and the cathode, may be disposed on mutually opposite surfaces of the polymer matrix, one surface side of the polymer film arrangement being configured as a flexible cover electrode and the respective other surface side being configured as a rigid base electrode. In other words, the polymer arrangement in this configuration is provided as a layer arrangement consisting of a flatly configured base electrode at the bottom, a polymer matrix film applied thereon with structuring particles disposed in it, and a flat flexible cover electrode applied on this polymer matrix. The thicknesses of the base electrode and the cover electrode are in this case, independently of one another, from 10 nm to 100 μm, preferably from 100 nm to 10 μm.

A cover electrode in the sense of the invention refers to an electrode which is disposed on the surface side of the polymer film arrangement which can be converted into a structured state by switching the electroactive polymer. On the other hand, according to the invention a base electrode is intended to mean an electrode which is disposed on a surface side of the polymer film arrangement which is not structured by the electrical switching. Both electrodes with positive and negative poling may at the same time be base electrodes in the polymer film arrangement according to the invention.

The terms top, bottom, below and above in the description of the invention refer only to the position of the constituents relative to one another, and are sometimes to be used interchangeably.

According to the invention, a flexible cover electrode is intended to mean that this electrode is configured so that it can adopt and replicate the shape changes and structuring which result from switching the electroactive polymer, in particular on the surface of the polymer matrix. In this way, when a suitable voltage is applied, the cover electrode then forms an outwardly directed, structured surface side of the polymer film arrangement.

The electrodes, both the cover electrode and the base electrode, may be conductive materials known to the person skilled in the art. According to the invention, for example, metals, metal alloys, conductive oligomers or polymers, for example polythiophenes, polyanilines, polypyrroles, conductive oxides, for example mixed oxides such as ITO, or polymers filled with conductive fillers may be envisaged for this. As fillers for polymers filled with conductive fillers, for example metals, conductive carbon-based materials, for example carbon black, carbon nanotubes (CNTs), or again conductive oligomers or polymers may be envisaged. The filler content of the polymers lies above the percolation threshold, so that the conductive fillers form continuous electrically conductive paths.

The electrodes may be produced by means of methods known per se, for example by metallisation of the surfaces, by sputtering, evaporation coating, chemical vapour deposition (CVD), vapour deposition (PVD), printing, doctor blading, spin coating, adhesive bonding or pressing on a conductive layer in prefabricated form, or by a spray electrode made of a conductive plastic.

In another embodiment of the polymer film arrangement according to the invention, the electrodes may be disposed on mutually opposite surfaces of the polymer matrix, the electrodes being disposed in a structured fashion on one or both surface sides of the polymer film arrangement. The polymer matrix is disposed as a polymer film between the electrodes in this configuration of the polymer film arrangement as well, a structured electrode in the sense of the invention being intended to mean that one of the electrodes or both form a regular or irregular pattern on the respective surface side of the polymer film arrangement. The electrodes may, for example, be configured as strips or in grid form. In this case, the electrodes may alternatively be applied on the surface of the polymer matrix or at least partially incorporated into the polymer matrix. The electrodes may also be fully incorporated into the polymer matrix. The electrodes may then lie flush with the surface of the polymer matrix respectively disposed between them, and form with it a smooth surface side of the polymer film arrangement, at least in the unswitched state.

In another configuration of the polymer film arrangement according to the invention, the electrodes may be disposed in a structured fashion as base electrodes on the first or second surface side. In this variant according to the invention, the anode and cathode lie on the same surface side of the polymer film arrangement. The other surface side, facing away from the electrodes, is formed by the polymer matrix in this configuration. In this configuration as well, the electrodes may alternatively be applied on the surface of the polymer matrix or at least partially incorporated into the polymer matrix. The electrodes may also be fully incorporated into the polymer matrix. The electrodes may then lie flush with the surface of the polymer matrix respectively disposed between them, and form with it a smooth surface side of the polymer film arrangement, at least in the unswitched state. This smooth surface side, which is thus formed together from electrode surfaces and the polymer matrix surfaces, may for example be applied on a substrate.

In the context of the invention, for this embodiment as well, structured disposition of the base electrodes is intended to mean that the anodes and cathodes form a regular or irregular pattern on one of the two surface sides of the polymer film arrangement. For example, with common application on one surface side, the anodes and cathodes may be disposed alternately. One possible way of achieving this straightforwardly is to use so-called comb electrodes, which can be disposed interdigitated and interengaging. Advantageously, the individual electrodes poled in the same way can thereby be switched together.

If the electrodes are disposed in a structured fashion as base electrodes on one surface side of the polymer film arrangement, according to another embodiment the polymer matrix may consist of an ionic electroactive polymer without any structuring particles being disposed in the polymer matrix. In this embodiment, the polymer matrix preferably consists of an elastomer which contains mobile ions. In other words, the polymer film of the electrically switchable polymer film arrangement in this embodiment according to the invention is formed from an ion-containing polymer composite in which at least one type of ion, anions or cations, is freely mobile. The ions may, for example, be introduced into the elastomer matrix in the form of an ionic liquid. If a voltage is applied, the freely mobile ions migrate to the corresponding electrodes. Depending on whether only one or both types of ions (anions, cations) are mobile in the polymer matrix, as a result of ion diffusion with an applied electric field the regions around one of the two electrode types (anode, cathode) will then swell up and can thus replicate the electrode structure on the surface side. The regions between the electrodes become depleted of ions, which can result in a volume contraction which further increases the difference from the elevations around the corresponding electrodes. A structured surface side of the polymer film arrangement can thus be formed in a simple way. The thickness of the base electrodes is in this case from 10 nm to 900 µm, preferably from 100 nm to 500 µm, particularly preferably from 1 µm to 200 µm.

According to another embodiment of the invention, the polymer matrix consists of an electroactive polymer and the structuring particles are electrically nonconductive hard material particles, ceramic hard material particles being excluded. Particularly preferably, the electrically nonconductive hard material particles may be made of glass or an electrically nonconductive polymeric material. Hard material particles in the sense of the invention are intended to mean particles which retain their shape and dimensions during the electrical switching. Glass and electrically nonconductive polymeric materials such as for example polyethylene (PE), polypropylene (PP), polyvinyl chloride (PVC), polymethyl methacrylate (PMMA), polycarbonate (PC) or polyurethane (PU) are particularly preferred, because they are very inexpensive. During electrical switching of the polymer film arrangement, the size, shape and distribution of the particles can thus be transferred onto the surface side having the flexible cover electrode. For example, in a combined embodiment having a flatly configured rigid base electrode and a flatly configured flexible cover electrode, and disposed between them an electroactive polymer matrix made of a dielectric elastomer, when applying a voltage the polymer matrix can be pressed together while the particles retain their shape. The shape and distribution of the particles can then be replicated by elevations on the surface side having the cover electrode. The thicknesses of the base electrode and the cover electrode are in this case, independently of one another, from 10 nm to 100 µm, preferably from 100 nm to 10 µm.

According to an alternative embodiment of the invention, the structuring particles consist of an electroactive polymer and the polymer matrix is formed from an elastomer. The switchable structuring particles are particles which can undergo a reversible shape and/or the volume change during electrical switching. Owing to this property, the particles can transfer their shape and distribution for example onto the elastic polymer matrix and optionally onto a flexible cover electrode, so that a structured surface side can be formed. This has the advantage that the actual polymer film only has to be adapted in respect of its stiffness so that, during electrical switching of the polymer film arrangement, it can adopt the shape change of the structuring particles. For the polymer matrix, therefore, already known coating systems may advantageously be envisaged which are already adapted to possible specific technical applications in respect of their other properties, such as gloss, abrasion strength, long-term stability or processability etc.

If alternatively the concept according to the invention with base electrodes disposed in a structured fashion is used, the switchable particles made of electroactive polymer may swell or change their shape in the vicinity of one electrode type, while the oppositely poled electrodes remain unchanged or shrink. The size and diameter of the particles is expediently adapted to the thickness of the polymer matrix so that the shape and/or volume change of the particles due to the electrical switching is transferred onto the surface side lying opposite the base electrodes, so that the resulting elevations reflect the electrode structuring and the distribution of the particles. The thickness of the base electrodes is in this case from 10 nm to 900 µm, preferably from 100 nm to 500 µm, particularly preferably from 1 µm to 200 µm.

In the embodiments according to the invention in which structuring particles made of electroactive polymers are used, i.e. switchable particles, these may touch one of the electrodes. In this case, in other words, there may thus be electrical contact of the individual particles with an electrode, which may possibly allow exchange of electrons. An electrode may in this case be in contact with a plurality of particles.

The electrically switchable polymer film arrangement according to the invention may be produced with the described variants as a self-supporting polymer film arrangement.

According to the invention, in another preferred configuration, the first or second surface side of the electrically switchable polymer film arrangement may be applied on a substrate, in which case the respective other surface side may be structured by the electrical switching of the electroactive polymer. The substrate may advantageously serve as a carrier and support body for the polymer film arrangement. Furthermore, the substrate may also be an article on which the polymer film arrangement according to the invention is applied as a surface coating.

The invention provides an electrically switchable polymer film arrangement, which has a first surface side and a second surface side which are disposed opposite one another, comprising at least one electrode pair consisting of an anode and a cathode and a polymer matrix, characterised in that structuring particles are optionally disposed in the polymer matrix, and the polymer matrix and/or the optionally provided structuring particles consist of an electroactive polymer, the first and/or second surface side being converted from a smooth state into a structured state by electrical switching of the electroactive polymer.

The invention furthermore provides an electrically switchable polymer film arrangement, which has a first surface side and a second surface side which are disposed opposite one another, comprising at least one electrode pair consisting of an anode and a cathode and a polymer matrix in which structuring particles are disposed, characterised in that the structuring particles are electrically nonconductive hard material particles and the polymer matrix consists of an electroactive polymer, or the structuring particles consist of an electroactive polymer, the first and/or second surface side being converted from a smooth state into a structured state by electrical switching of the electroactive polymer.

The invention furthermore provides an electrically switchable polymer film arrangement, which has a first surface side and a second surface side which are disposed opposite one another, comprising at least one electrode pair consisting of an anode and a cathode and a polymer matrix which consists of an electroactive polymer, the first and/or second surface side being converted from a smooth state into a structured state by electrical switching of the electroactive polymer, characterised in that the anode and cathode are configured as base electrodes and are disposed in a structured fashion on the first or second surface side.

The invention furthermore comprises the use of a polymer film arrangement according to the invention. In particular, the invention provides an electrically switchable surface coating comprising an electrically switchable polymer film according to the invention in the variants and embodiments described above. This surface coating may be applied for example on articles, for example car bodywork or a ship's hull. The surface coating according to the invention may advantageously be influenced actively by the electrical switchability of the polymer film arrangement. This active influence may take place statically or at different frequencies.

The invention also comprises the use of such an electrically switchable surface coating for the generation of haptic, acoustic and/or optical signals. This may for example involve variable haptics, for example switching between a smooth surface and a rough surface. This effect may for example be used for self-cleaning of surfaces, deicing of surfaces and anti-fouling ship hull surfaces. Optical properties may also be influenced by switching the polymer film arrangement according to the invention, so that for example it is possible to switch between a transparent surface and an opaque surface.

Furthermore, these haptic and optical effects may also be used for man-machine interfaces, for example context-driven menu management.

According to the invention, it is furthermore possible to influence the flow behaviour of fluids. For example, the invention may thus be used to avoid turbulence or reduce flow resistance.

Advantageously, the invention can therefore be implemented in a multiplicity of different applications.

The invention will be explained below by way of example in connection with the figures, without being restricted to these preferred embodiments.

Figure 3A:
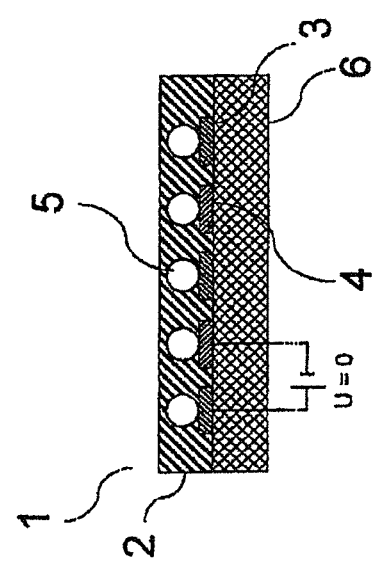
Figure 4B:
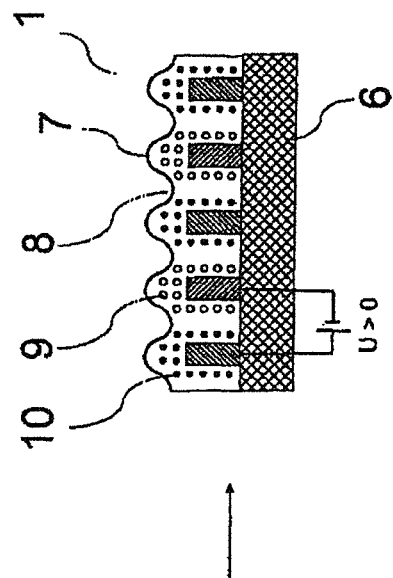
Figure 4A:
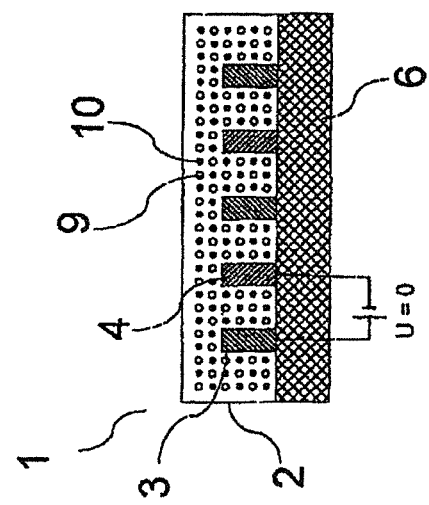

FIG. 1a and FIG. 1b show a schematic sectional view of an electrically switchable polymer film arrangement according to the invention, having a switchable electroactive polymer matrix and hard material particles disposed therein, FIG. 2a and FIG. 2b show a schematic sectional view of an electrically switchable polymer film arrangement according to the invention, having switchable structuring particles in an elastomer matrix, FIGS. 3a and 3b show a schematic sectional view of an electrically switchable polymer film arrangement according to the invention, having switchable structuring particles in an elastomer matrix and electrodes applied in a structured fashion, FIG. 4a and FIG. 4b show a schematic sectional view of an electrically switchable polymer film arrangement according to the invention, having electrodes applied in a structured fashion and freely mobile anions and cations in an elastomer matrix.

The embodiments shown, which are denoted by "a", respectively show the polymer film arrangement before applying an electrical voltage, and the figures denoted by "b" respectively show the corresponding polymer film arrangement after applying an electrical voltage. FIGS. 1a and 1b show an electrically switchable polymer film arrangement 1 according to the invention having a switchable polymer matrix 2, which is embedded between flat electrodes 3 and 4. The polymer matrix 2 may for example consist of a dielectric elastomer, for example silicone elastomers, polyurethane elastomers, polyacrylate elastomers or rubber. Electrically nonconductive hard material particles 5 may furthermore be disposed as structuring particles in the polymer matrix 2.

Merely for the sake of clarity, only three particles 5 are shown in each case. These particles 5 may consist for example of glass, silicon carbide, ceramic or a hard electrically nonconductive polymer. In the embodiment shown, the electrode 3 is configured as a flexible cover electrode 3. The electrode 4 is configured as a base electrode and disposed on a substrate 6. As shown by FIG. 1a, the particles 5 are dimensioned so that the polymer matrix 2 and the cover electrode 4 have a smooth surface without an applied electric field. In other words, the polymer film arrangement 1 has a first smooth surface side. When a voltage is applied, as shown in FIG. 1b, the dielectric elastomer is then pressed together between the electrodes 3, 4 while the hard particles 5 maintain their shape. According to the invention, the particles 5 are furthermore dimensioned and adapted to the thickness of the polymer matrix 2 so that haptically and/or optically perceptible structuring with elevations 7 and depressions 8 can be formed on the first surface side when a voltage is applied to the polymer film arrangement 1. In the sense of the invention, perceptible structuring is intended to mean that it is at least detectable. Detection may be carried out for example by optical methods, for example diffraction or refraction. The dimension and shape of the surface structure may advantageously be influenced and variably adjusted through the size, shape and distribution of the hard particles 5, through the selection of the polymeric material for the polymer matrix 2 and the applied electric field.

FIG. 2a and FIG. 2b show a schematic sectional view of an electrically switchable polymer film arrangement 1 according to the invention having switchable particles 5 in an elastic polymer matrix 2. In the embodiment shown, the electrode 3 is configured as a flexible cover electrode 3. The electrode 4 is configured as a base electrode and disposed on a substrate 6. The particles 5 may for example consist of ionic EAPs or field-activated EAPs, which undergo a shape and/or volume change when an electrical voltage is applied to the electrodes 3, 4. The particles 5 may touch one of the electrodes 3, 4 in the polymer arrangement 1. The particles 5 are in this case configured in their dimensions so that, when a voltage is applied, their shape and distribution over the polymer matrix 2 is replicated by the flexible cover electrode 3 and a surface structure with elevations 7 and depressions 8 can thereby be generated. One advantage of this preferred configuration is that the polymer film 2 only has to be adjusted in respect of its stiffness so that it can adopt the shape change of the switchable particles 5 and impart it to the flexible cover electrode 3. For this polymer matrix 2, therefore, already known coating systems may be envisaged which are already adapted to specific technical applications in respect of their other properties, such as gloss, abrasion strength, long-term stability and processability. In another embodiment, the elastomer matrix 2 may also contain mobile ions, anions and/or cations, in addition to the particles 5. These mobile ions may diffuse from the polymer matrix 2 into the particles 5, or diffuse out of them, during the switching process so that a shape and/or volume change of the particles 5 can be achieved.

FIGS. 3a and 3b show a schematic sectional view of an electrically switchable polymer film arrangement 1 according to the invention having switchable structuring particles 5 in an elastic matrix 2 and base electrodes 3, 4 disposed in a structured fashion. The electrodes 3, 4 are disposed alternately. They may be configured as interdigitated comb electrodes which, advantageously, may respectively be poled together. In this representation, the electrodes 3, 4 are incorporated into the polymer matrix 2 and lie flush with it on one surface side. This surface side is disposed on a substrate 6. The switchable particles 5 may preferably consist of an ionic EAP. The particles 5 may touch one of the electrodes 3, 4 in the polymer arrangement 1. For the sake of clarity, only one particle 5 is represented per electrode 3, 4. The particles 5 can swell on one electrode 3 during the switching process, while the particles 5 on the oppositely poled electrode remained almost unchanged or shrink. The size of the particles 5 is expediently adapted to the thickness of the polymer matrix 2 so that the shape and/or volume change of the particles 5 due to the electrical switching is transferred onto the surface side lying opposite the electrodes 3, 4. The resulting elevations 7 and depressions 8 can advantageously reflect the electrode structuring and the distribution of the particles 5. In another embodiment, the elastomer matrix 2 may also contain mobile ions, anions and/or cations, in addition to the particles 5. These mobile ions may diffuse from the polymer matrix 2 into the particles 5 of them, or diffuse out of them, during the switching process so that a shape and/or volume change of the particles 5 can be achieved.

FIGS. 4a and 4b show a schematic sectional view of an electrically switchable polymer film arrangement 1 according to the invention having base electrodes 3, 4 disposed in a structured fashion and freely mobile anions 9 and cations 10 in an elastomer matrix 2. The polymer matrix 2 is applied with one surface side on a substrate 6. The polymer film, comprising the polymer matrix 2 and ions 9, 10, of the electrically switchable polymer film arrangement 1 may in this embodiment according to the invention be formed from an ion-containing polymer composite, in which at least one type of ion is freely mobile. If a voltage is applied, the freely mobile ions migrate to the corresponding electrodes. Depending on whether only one type of ion or, as shown in FIGS. 4a and 4b, anions 9 and cations 10 are mobile in the polymer matrix 2, as a result of ion diffusion with an applied electric field the regions around one of the two electrodes 3, 4 will then swell up and can thus replicate the electrode structure on the surface side. The regions between the electrodes 3, 4 become depleted of ions, which can result in a volume contraction and therefore depressions 8 on the surface side, which further increases the difference from the elevations 7 around the corresponding electrodes 3, 4. A structured surface side can thus be formed in a simple way. Such a configuration of the invention may, for example, be produced by mixing an ionic liquid into a polyurethane (PUR) matrix material as the polymer film. The invention will be explained further by the examples given below, without being restricted to them.

EXAMPLES

Example 1

Production of an Electrically Switchable Polymer Film Arrangement Having Structured Base Electrodes A polyurethane (PUR) formulation consisting of 82-99 wt. % of Desmodur® E15 (Bayer MaterialScience AG) as an isocyanate and 1 wt. % of triethanolamine (TEA) as a crosslinker was used. In order to increase the mixability with ionic liquids, 0-17 wt. % of polyethylene glycol (PEG 600) were added, the constituents adding up to 100 wt. %. This reaction formulation was stirred manually with 1-butyl-3-methylimidazolium bis(trifluormethylsulfonyl)-imide as an ionic liquid (IL) in a mixing ratio of 1:1 and doctor bladed onto comb electrodes, which were already disposed on a substrate. The electrodes consisted of interdigitated copper conductor tracks with regular electrode spacings of 0.25 mm-4 mm, which were applied on an epoxy substrate (FR4). The height of the electrically conductive Cu electrodes above the epoxy substrate being used was 70 μm. The reactive polymer mixture was cured at a temperature of up to 60° C. This resulted in a transparent, homogeneous film with a smooth surface and a thickness of 150 μm. The current-voltage characteristic of the samples with a size of about 10 cm×10 cm was studied at a voltage of 2 V. When applying the voltage of 2 V, a pronounced current peak was registered; the current subsequently decreased to a constant residual current. When switching off the voltage, a large current initially flowed in the opposite direction, and then returned asymptotically to 0 A. So that no electrolysis, and therefore no chemical reaction process, took place, the applied voltage was kept below the electrochemical potentials of the ions of the ionic liquid and the polyurethane matrix. The voltage-induced migration of the ions into the PUR matrix took place on a time scale of seconds and was reversibly switchable. The switching of the surface structure of the polymer film arrangement according to the invention by the ion migration inside the PUR film could be observed with the aid of the displacement of a laser beam reflected from the surface side of the polymer film arrangement according to the invention.

Example 2

In a further experiment a 2K polyurethane, which is available under the designation "ISO-PUR A 776" from ISO-Elektra GmbH as a "self-healing gel", was used as the polymer matrix. This was mixed similarly as in Example 1 in a weight ratio of 1:1 with methyl ethyl imidazolium-octyl sulfate as an ionic liquid. The mixture was applied as described in Example 1 as a film onto a substrate having interdigitated base electrodes disposed thereon, and was switched by an electric field. The displacement of a laser beam reflected from the surface side of the polymer film arrangement according to the invention, when applying a voltage of 2 V to this very soft PUR-IL composite, was changed more greatly than with the PUR formulation described in Example 1. From this, it could be deduced that the surface structure of an electrically switchable polymer film arrangement according to the invention changes more strongly in comparison.

In summary, the invention provides electrically switchable polymer film arrangements with which the structure of surfaces and surface coatings can be actively switched and influenced.

Owing to the variable adjustability of the properties of the electrically switchable polymer film arrangements according to the invention, they can advantageously be adapted to a wide variety of requirements of special applications.

The invention claimed is:

1. A device comprising:
an electrically switchable polymer film arrangement comprising a first surface side and a second surface side which are disposed opposite one another, the electrically switchable polymer film arrangement comprising:
at least one electrode pair comprising an anode and a cathode;
a polymer matrix; and
structuring particles disposed in the polymer matrix,
wherein the polymer matrix and/or the structuring particles comprise an electroactive polymer, the first and/or second surface side being converted from a smooth state into a structured state by electrical switching of the electroactive polymer and
wherein the structured state comprises elevations and depressions in the first and/or second surface side that reflect an electrode structuring and wherein the elevations or depressions reflect a distribution of the structuring particles.

2. The device according to claim 1, wherein the electroactive polymer is a field-activated polymer or an ionic electroactive polymer.

3. The device according to claim 1, wherein the electrically switchable polymer film arrangement has a thickness of ≥10 μm and ≤1 mm in the smooth state.

4. The device according to claim 1, wherein a diameter of the structuring particles is from 50 to 90% of the thickness of the polymer film arrangement.

5. The device according to claim 1, wherein the anode and cathode are disposed on mutually opposite surfaces of the polymer matrix, one surface side of the polymer film arrangement is configured as a flexible cover electrode and the respective other surface side is configured as a rigid base electrode.

6. The device according to claim 1, wherein the anodes and the cathodes are disposed on mutually opposite surfaces of the polymer matrix, and the electrodes are disposed in a structured fashion on one or both surface sides of the polymer film arrangement.

7. The device according to claim 1, wherein the polymer matrix comprises an electroactive polymer and the structuring particles comprise electrically nonconductive hard material particles, excluding ceramic hard material particles.

8. The device according to claim 1, wherein the structuring particles comprise a glass or an electrically nonconductive polymeric material selected from at least one of the group consisting of polyethylene, polypropylene, polyvinyl chloride, polymethyl methacrylate, polycarbonate and polyurethane.

9. The device according to claim 6, wherein the polymer matrix comprises an ionic electroactive polymer and no structuring particles are disposed in the polymer matrix.

10. The device according to claim 1, wherein the structuring particles consist of an electroactive polymer and the polymer matrix is formed from an elastomer.

11. The device according to claim 1, wherein the first or second surface side is applied on a substrate, the respective other surface side being converted into a structured state by electrical switching of the electroactive polymer.

12. An electrically switchable surface coating comprising the electrically switchable polymer film arrangement according to claim 1.

13. A device comprising:
an electrically switchable polymer film arrangement comprising a first surface side and a second surface side which are disposed opposite one another, the electrically switchable polymer film arrangement comprising:
at least one electrode pair comprising an anode and a cathode;
a polymer matrix; and
structuring particles disposed in the polymer matrix,
wherein the polymer matrix and/or the structuring particles comprise an electroactive polymer, the first and/or second surface side being converted from a smooth state into a structured state by electrical switching of the electroactive polymer, and
wherein the structured state comprises elevations in the first and/or second surface side, wherein the elevations reflect a distribution of the structuring particles.

14. A device comprising:
an electrically switchable polymer film arrangement comprising a first surface side and a second surface side which are disposed opposite one another, the electrically switchable polymer film arrangement comprising:
at least one electrode pair comprising an anode and a cathode;
a polymer matrix; and
freely mobile anions and cations disposed in the polymer matrix,
wherein the first and/or second surface side being converted from a smooth state into a structured state by electrical switching of the electroactive polymer,
wherein the structured state comprises elevations in the first and/or second surface side that reflect an electrode structuring by ion diffusion in the region of at least one of the electrodes, and
wherein the structured state comprises depressions in the first and/or second surface side that reflect replicate an electrode structuring by ion depletion in the region between the at least one electrode pair.

* * * * *